United States Patent [19]

Thomas et al.

[11] 4,314,182
[45] Feb. 2, 1982

[54] SYSTEM FOR CONTROLLING THE POWER OF A HIGH-VOLTAGE ELECTRON BEAM GENERATOR

[75] Inventors: Friedrich W. Thomas; Wolfgang Sperzel; Jürgen Petzoldt, all of Gelnhausen, Fed. Rep. of Germany

[73] Assignee: Leybold-Heraeus GmbH, Cologne, Fed. Rep. of Germany

[21] Appl. No.: 153,516

[22] Filed: May 27, 1980

[30] Foreign Application Priority Data

Jul. 13, 1979 [DE] Fed. Rep. of Germany ....... 2928301

[51] Int. Cl.³ .................... H05B 7/02; H01J 37/30
[52] U.S. Cl. ..................... 315/307; 315/106; 315/107; 315/291
[58] Field of Search ............. 315/106, 107, 291, 307, 315/311; 250/492 R; 219/121 EB

[56] References Cited

U.S. PATENT DOCUMENTS

| | | | |
|---|---|---|---|
| 3,689,798 | 9/1972 | Brukovsky et al. | 315/106 |
| 3,838,313 | 9/1974 | Anderson | 315/291 |
| 4,045,707 | 8/1977 | Gernot et al. | 315/107 X |

*Primary Examiner*—Eugene La Roche
*Attorney, Agent, or Firm*—Sprung, Felfe, Horn, Lynch & Kramer

[57] ABSTRACT

A system for the control of power of a high-voltage electron beam generator having a cathode and a control electrode for the cathode, has a controller at ground potential, a pulse generator for the production of square-wave voltage pulses symmetrical with ground potential, a transformer for transferring high-voltage potential to the beam generator including a primary winding substantially at ground potential and a secondary winding at high-voltage potential, a full-wave rectifier connected to the secondary winding and a filter connecting the rectifier to the cathode and to the control electrode. The filter comprises an LC combination of at least two LC members connected in series, in conjunction with at least two capacitors, one parallel to the cathode-control electrode and the other parallel to the full-wave rectifier, the resonance frequencies of the LC members being in a ratio of approximately 2:1.

2 Claims, 1 Drawing Figure

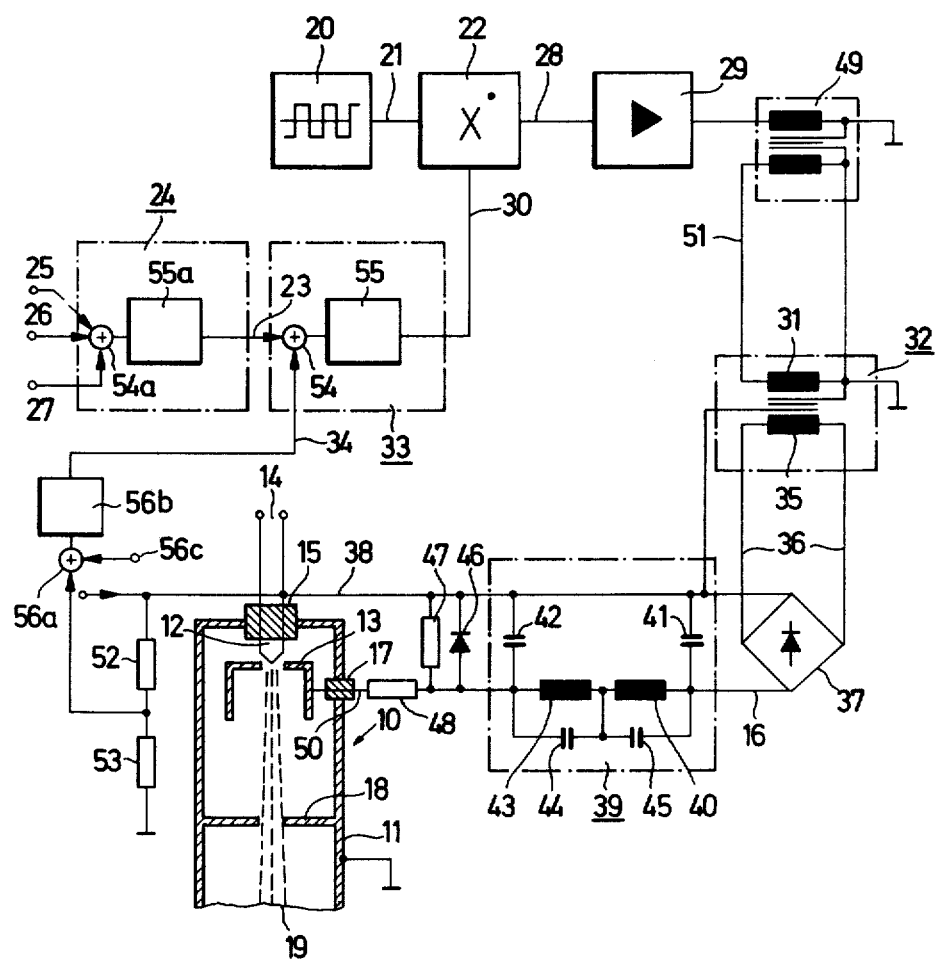

SYSTEM FOR CONTROLLING THE POWER OF A HIGH-VOLTAGE ELECTRON BEAM GENERATOR

BACKGROUND OF THE INVENTION

The invention relates to a system for controlling the power of a high-voltage electron beam generator having a cathode and a control electrode associated with the cathode, having a regulator at ground potential and a pulse generator for the production of square-wave voltage pulses symmetrical with the null line, for whose transfer to the part of the system that is at high-voltage potential a high-voltage isolating transformer is present, having a primary winding at substantially ground potential and a secondary winding at high-voltage potential and connected to a full-wave rectifier which is connected to the cathode and control electrode by means of a circuit having passive elements and acting as a filter.

Control systems of the kind described above are used in many fields of electron beam technology, but principally for the melting, welding, processing and vaporizing of materials of all kinds by means of electron beams, preferably under vacuum. To vary the intensity of an electron beam, the heat output of the incandescent cathode, the bias voltage of the control electrode, and/or the applied acceleration voltage can be varied.

In high-voltage electron beam generators which are generally operated with an anode voltage in excess of 20 kilovolts and therefore have a relatively low beam current at a given output, a cylindrical control electrode is disposed in the vicinity of the cathode, which is often referred to as a Wehnelt cylinder. With this control electrode it is possible to vary the beam current between 0 and 100%. For this purpose a negative voltage of variable amplitude with respect to the cathode is applied to the control electrode, and suppresses the emergence of the electrons in the direction of the anode, doing so to a greater or lesser extent according to the magnitude of this control voltage. The voltage level required for the sure blocking of the electron beam generator is one to two kilovolts, depending on the way the control electrode is made. The maximum beam current is reached when the cathode and control electrode are at virtually the same potential.

Through German Auslegeschrift No. 1,131,760 a system of the kind described above is known in which the control electrode is periodically fed with pulses which are superimposed on a direct-current voltage. This is intended to bring it about that the electron beam will be turned on intermittently. What is involved, therefore, is a constant turning on and off of an electron beam of always constant power, while nevertheless the power output is variable. The power can also be influenced in this case by the relative on-time of the electron beam. In this known system, however, the DC component of the control voltage is not applied to the control electrode, so that continuous power control of the electron beam generator is not possible. A continuous power control, however, is necessary for a number of purposes, such as for example in welding for raising the power at the beginning and at the end of a seam, in the welding of workpieces of different thickness, when vaporizing, etc.

A continuously varying or constant DC voltage can also be achieved by the homopolar concatenation of square and/or trapezoidal pulses, in which the envelope curve of the pulses is then the determining factor.

Through German Offenlegungsschrift No. 2,514,805 a system is known for the power control of high-voltage electron beam generators in accordance with the initial description in the background the present specification, which makes use of the principle of the concatenation of square-wave pulses on the secondary side of the high-voltage transformer.

In this case the transformer is equipped on the low-voltage side with a third winding, and the circuit that is on the high-voltage side and acts as a filter is in the form of an RC circuit. The third winding has the disadvantage that it is suitable only for frequencies up to a maximum of about 1 KHz. The RC circuit has an excessively long time characteristic, which is to be attributed to the fact that two requirements are diametrically opposed: on the one hand a low ripple is required in the high voltage, and this calls for a large capacity in the condenser. On the other hand, a rapid response is required in the controlling action, and this requirement can be satisfied only with a condenser of small capacity. The filter in any case determines the ripple in the high DC voltage. Hence, the known system is not suitable for the required high regulating speeds or frequencies to be handled.

SUMMARY OF THE INVENTION

It is the object of the invention to devise a fast-responding system of low DC voltage ripple for the continuous control of the power of a high-voltage electron beam generator, in which the control voltage serving as the manipulated variable can be transferred through an isolating transformer without the need for active circuit components such as transistors, tubes or auxiliary voltages on the high-voltage side.

The achievement of the above-stated object is accomplished in accordance with the present invention, in the system described in the beginning, in that the circuit is an LC combination of at least two LC members in series, in conjunction with at least two capacitors connected one parallel to the cathode-control electrode arrangement on the one hand and the other to a full-wave rectifier, the resonance frequencies of the LC circuits being in a relationship of approximately 2:1.

With the system of the invention, active components such as transistors, tubes or auxiliary voltages on the high-voltage side become unnecessary. The size of the shielded housing of the control system, which is at the cathode potential, becomes minimal. This is an advantage that is not to be underestimated, since often there is not enough space to accommodate electrical components.

The system of the invention at the same time permits not only a continuous control of the power of a high-voltage electron beam generator, but also, if desired, a pulsed control, in case, for example, pulsed operation is required in electron beam welding. The transfer of both continuous and individual pulses is accomplished rapidly and without distortion. The control signal produced at the same time generally has an extremely low ripple.

The design of the pulse generator according to the generic concept of the invention such that the pulses are square-wave pulses symmetrical with the null line has the purpose of concatenating the individual pulses in a gap-free manner. By means of the full-wave rectifier it is brought about that the pulses of alternating positive and negative polarity appearing on the secondary side of the transformer are converted to an uninterrupted series of pulses of the same polarity.

The square-wave pulses delivered by the pulse generator are best multiplied, before they are fed to the amplifier, by a value which is obtained in a comparator circuit by comparing the actual value with a desired value. In this manner an amplitude-modulated carrier frequency is obtained, which is recovered in the above-described manner on the high-voltage side of the isolating transformer and, after rectification and smoothing, forms the control voltage for the beam control cylinder.

The gaps that occur between the individual pulses are closed by the circuit of the invention, which acts as a filter. The components of the circuit are designed such that a smoothing of the beam control voltage takes place, but there is no substantial loss of the speed of the control of the beam current. Since the gaps in the pulse series have substantially twice the frequency of the pulse generator, the filter is designed as a blocking filter.

BRIEF DESCRIPTION OF THE DRAWING

An example of the system of the invention and its manner of operation will now be further described in conjunction with the drawing wherein a schematic of the system is shown.

DETAILED DESCRIPTION OF THE INVENTION

In the FIGURE, 10 identifies a high-voltage electron beam generator consisting of a grounded casing 11, a cathode (incandescent cathode) 12 and a control electrode (Wehnelt cylinder) 13. The cathode 12 is supplied with a heating current through the terminals 14. The leads are brought through the casing 11 by means of a lead-through insulator 15. The line to the control electrode 13 is brought through the casing 11 by means of a lead-through insulator 17. An accelerating anode 18 is part of the casing. On the basis of the system shown, which is known, an electron beam 19 is formed when the proper voltages are applied, and can be used for the purposes which were described in the introduction.

The power control system has a pulse generator 20, which is made such that the pulses are square-wave pulses of constant amplitude and constant frequency which are symmetrical with the null line. The frequency is, for example, 20 KHz. The output of the pulse generator is connected by a line 21 to a multiplier 22 which receives via line 30 a DC voltage signal which is supplied by a compensation circuit 33.

The compensation circuit 33 is supplied through line 23 with a control voltage, and through line 34 with the deviation of the high voltage. This deviation is formed on the basis of a voltage divider 52 having the base resistance 53, through a summing point 56a and an amplifier 56b. The required high voltage level is fed to the summing point through the terminal 56c. Parts 56a, 56b and 56c can be omitted if the ripple of the high voltage is slight. The compensating circuit 33 consists essentially of the combination of a summing point 54 and a control amplifier 55 of proportional action. The purpose of this compensating circuit is the detection of any high voltage ripple that might occur, and to produce an error signal associated therewith to influence the beam current. It is in this manner that any ripple in the beam current, caused by the high voltage, is reduced.

The control voltage is supplied by a regulator unit 24 which is similar in construction to the compensating circuit 33, i.e., it has a summing point 54a and a regulating amplifier 55a, but it has a proportional-plus-integral or proportional-plus-integral-plus-derivative action. A reference voltage supplied by a potentiometer is delivered through a terminal 26 to the regulating circuit, while the actual value of the beam current is applied to an input terminal 27. The determination of the beam current is accomplished by one of the known methods and is not further indicated in the FIGURE. Reference values and pulses from external function generators can be applied selectively to the input terminal 25. By a comparison of the input levels in the controller 24, a constantly variable control voltage is formed, which forms the later envelope curve of the series of pulses. In the multiplier 22 an amplitude-modulated control signal is formed, which is delivered through a line 28 to an amplifier 29. The level of the square-wave voltage present at line 28 is always so great that the reference current and the beam current are the same. In the amplifier 29 the required voltage is produced, which is connected to the primary winding 31 of an isolating transformer 32 through a separating transformer 49. The purpose of the separating transformer 49 is to keep away from the amplifier 29 any overvoltage pulses which are produced by short circuits in the beam generator.

The isolating transformer 32 has primary winding 31 connected to the secondary of transformer 49 by line 51 and a secondary winding 35 which is connected by lines 36 to a full-wave rectifier 37. In the latter the output pulses of the isolating transformer 32 are rectified, while on the basis of the design of the pulse generator 20 a series of pulses is generated whose envelope curve corresponds to the output signal of the controlling system 24 and of the compensating system 33. The output signal from the full-wave rectifier 37 is delivered through line 16 to the circuit 39 acting as a filter, which is an LC combination of at least two LC members 40,45 and 43,44 in conjunction with at least two capacitors 41,42 applied parallel to the cathode-control electrode circuit 12,13 and to the full-wave rectifier 37, the resonance frequencies of the LC circuits being in a ratio of approximately 2:1.

The capacitor 45 and the choke 40, which together form one of the LC members, constitute a circuit for blocking the fundamental wave, which occurs in spite of full-wave rectification, due to unsymmetries.

The capacitor 44 and the choke 43, which together form the other LC circuit, constitute a circuit for blocking the first harmonic. The capacitor 42 at the output serves only for clipping voltage peaks coming from the beam generator 10, while capacitor 41 is known as a charging condenser. Parallel to the circuit 39 is a resistor 47 which, in conjunction with capacitor 42, determines the rise time or pulse edge slope. Parallel to resistor 47 a fast-acting protective diode 46 is connected in the blocking direction, which, in the event of a short circuit in the gun (in this case the control electrode 13 is at ground potential), will protect the circuit 39 and the full-wave rectifier 37. The resistor 47 in this case damps and limits the diode current. The resistors 47 and 48 furthermore bring it about that the controlling voltage for the control electrode 13 of the beam generator is produced with a low internal resistance, thereby preventing the electrostatic charging of the control electrode 13. The output signal from the circuit 39 is connected through the resistor 48 and a line 50 and an additional line 38 to the control electrode 13 on the one hand and the cathode 12 on the other.

The subject of the invention is outstandingly suited also for supplying the circuit with pulse-width modulated square-wave voltage pulses having a constant repeat frequency, inasmuch as in these the fundamental wave is of a particularly strong configuration.

What is claimed is:

1. In a system for the control of power of a high-voltage electron beam generator having a cathode and a control electrode for the cathode, of the type having a controller at ground potential, a pulse generator for the production of square-wave voltage pulses symmetrical with ground potential, a transformer for transferring high-voltage potential to the beam generator including a primary winding substantially at ground potential and a secondary winding at high-voltage potential, a full-wave rectifier connected to the secondary winding and a filter connecting the rectifier to the cathode and to the control electrode, the improvement wherein the filter comprises: an LC combination of at least two LC members connected in series, in conjunction with at least two capacitors, one parallel to the cathode-control electrode and the other parallel to the full-wave rectifier, the resonance frequencies of the LC members being in a ratio of approximately 2:1.

2. The system of claim 1, further comprising a protective diode disposed in parallel to the at least two capacitors.

* * * * *